United States Patent
Baroky et al.

(10) Patent No.: US 7,075,225 B2
(45) Date of Patent: Jul. 11, 2006

(54) WHITE LIGHT EMITTING DEVICE

(76) Inventors: Tajul Arosh Baroky, 3 Tingkat Besi, Island Park, Penang 11600 (MY); Bee Yin(Janet) Chua, 1-6 Lintang Paya Terubong 6, Air Itam, Penang 11500 (MY)

( * ) Notice: Subject to any disclaimer, the term of this patent is extended or adjusted under 35 U.S.C. 154(b) by 224 days.

(21) Appl. No.: 10/609,160

(22) Filed: Jun. 27, 2003

(65) Prior Publication Data

US 2004/0263073 A1    Dec. 30, 2004

(51) Int. Cl.
 *H01L 33/00* (2006.01)
(52) U.S. Cl. .................. 313/503; 313/501; 257/98
(58) Field of Classification Search .............. 313/498, 313/501, 502, 503, 512; 252/301.4 R, 301.4 S; 257/98
See application file for complete search history.

(56) References Cited

U.S. PATENT DOCUMENTS

| 5,302,966 | A | * | 4/1994 | Stewart ..................... 345/76 |
| 5,813,753 | A | | 9/1998 | Vriens et al. ............... 362/293 |
| 5,929,999 | A | * | 7/1999 | Butterworth ................ 356/405 |
| 5,998,925 | A | | 12/1999 | Shimizu et al. ............. 313/503 |
| 6,180,029 | B1 | | 1/2001 | Hampden-Smith et al. ............ 252/301.4 |
| 6,521,915 | B1 | * | 2/2003 | Odaki et al. .................. 257/98 |
| 6,576,488 | B1 | | 6/2003 | Collins, III et al. .......... 438/29 |
| 6,776,927 | B1 | * | 8/2004 | Mitomo et al. ........ 252/301.4 R |
| 2001/0050371 | A1 | | 12/2001 | Odaki et al. |
| 2002/0187571 | A1 | | 12/2002 | Collins, III et al. .......... 438/29 |
| 2004/0212295 | A1 | | 10/2004 | Chua et al. ................. 313/503 |

FOREIGN PATENT DOCUMENTS

| DE | 19638667 A1 | 9/1996 |
| DE | 10036940 A1 | 7/2000 |
| EP | 1 150361 A1 | 4/2001 |
| GB | 2373368 A | 12/2001 |
| WO | WO 00/63977 | 4/2000 |
| WO | WO 00/33390 | 8/2000 |
| WO | WO 03/034508 | 4/2004 |

* cited by examiner

*Primary Examiner*—Karabi Guharay

(57) ABSTRACT

The invention provides light emitting devices having a phosphor layer that are useful as sources of white light, and other applications. The invention provides a light emitting device having a LED and a phosphor composition positioned to receive light from the LED. The LED is adapted to emit cyan light, and the phosphor composition is adapted to absorb cyan light from the LED and emit red light.

16 Claims, 1 Drawing Sheet

WHITE LIGHT EMITTING DEVICE

FIELD OF THE INVENTION

The invention relates generally to light emitting devices and more particularly to light emitting diodes with a phosphor layer, which are useful as sources of white light, and other applications.

BACKGROUND OF THE INVENTION

Conventional white light sources include such devices as incandescent and fluorescent lamps. Such devices have several undesirable characteristics, including size, power consumption, limited operating life, among others. Alternative white light sources having improved characteristics are desired.

Semiconductor devices have been investigated as alternative sources of white light with a goal of finding white light sources that are both power efficient and cost efficient. Light emitting diodes (LEDs) are compact and emit light of clear color with high efficiency. Because they are solid-state elements, LEDs have long operating lifetimes, have good initial drive characteristics, exhibit good vibration resistance, and withstand repetitive ON/OFF operations. Thus, they have been widely used in such applications as various indicators and various light sources. In many applications, LEDs can provide suitable sources of light with low power consumption.

Conventional LEDs typically have a narrow emission spectrum (generate monochromatic light), and thus do not have a broad emission spectrum necessary to provide white light. Recently, devices using a combination of LEDs to provide three light components of red, green, and blue (R, G and B) have been used to provide white light. Large screen LED displays using these light emitting diodes have been put into use. Strategies for diffusing and mixing the light emitted by the LEDs become important in such devices to generate white light of the desired tone, luminance and other factors of the light emission of such devices. Also, combining three diodes (R, G and B) to provide white light requires a larger package than a single diode. Recently developed devices incorporate multiple light-generating active regions on a single semiconductor chip, where the multiple active regions each emit in a distinct wavelength region such that the combination of active regions cover the visible spectrum to emit white light.

Another typical approach for generating white light combines UV or blue light emitting diodes (LEDs) with luminescent materials (such as phosphors) that down-convert the LED emission to longer wavelength light. In such devices, the UV or blue light emission from an active region of a light emitting diode activates (excites) a phosphor composition that is positioned to receive the LED emitted light. In turn, the excited phosphor composition emits light at a longer wavelength. The net result is a light emitting device that emits light having a plurality of wavelengths over the visible spectrum. An appropriate combination of different wavelengths over the visible spectrum can be perceived as white light by the human eye. The composition of the phosphor is typically adjusted to change the color balance of the emitted light. In some cases, the phosphor composition contains more than one phosphor, wherein each phosphor emits at a different wavelength.

For example, U.S. Pat. No. 5,813,753 and U.S. Pat. No. 5,998,925 disclose light emitting devices in which a blue LED disposed in a reflective cup is surrounded by a phosphor composition. The blue LED emits blue light, a portion of which excites the phosphors in the phosphor composition. The phosphors are selected such that they emit red and green light upon excitation. The device will typically emit a combination of blue light (unabsorbed emission from the LED), and red light and green light (from the phosphors). The combination of wavelengths of light can be perceived by the human eye as white. The phosphor typically ages over the lifetime of the device, changing the efficiency with which the LED emission is converted to higher wavelength. Thus the output light characteristic of the device changes over the lifetime of the device, especially where multiple phosphors are used.

Thus, a white light emitting device is desired that is relatively small, light weight, has a long effective operating life, is power efficient, and is economical.

SUMMARY OF THE INVENTION

The invention addresses the aforementioned deficiencies in the art, and provides novel white light emitting devices having desirable power consumption characteristics.

The invention provides a light emitting device having a LED and a phosphor composition positioned to receive light from the LED. The LED is adapted to emit cyan light, typically in the 490 nm to 530 nm range. The phosphor composition is adapted to absorb cyan light from the LED and emit red and/or red-orange light, typically in the 590 nm to 650 nm range. The phosphor composition typically includes phosphor particles and a binder material immobilizing the phosphor particles to a phosphor-bearing surface.

Additional objects, advantages, and novel features of this invention shall be set forth in part in the descriptions and examples that follow and in part will become apparent to those skilled in the art upon examination of the following specifications or may be learned by the practice of the invention. The objects and advantages of the invention may be realized and attained by means of the instruments, combinations, compositions and methods particularly pointed out in the appended claims.

BRIEF DESCRIPTION OF THE DRAWINGS

These and other features of the invention will be understood from the description of representative embodiments of the method herein and the disclosure of illustrative apparatus for carrying out the method, taken together with the Figures, wherein.

To facilitate understanding, identical reference numerals have been used, where practical, to designate corresponding elements that are common to the Figures. Figure components are not drawn to scale.

DETAILED DESCRIPTION

Figure 1:
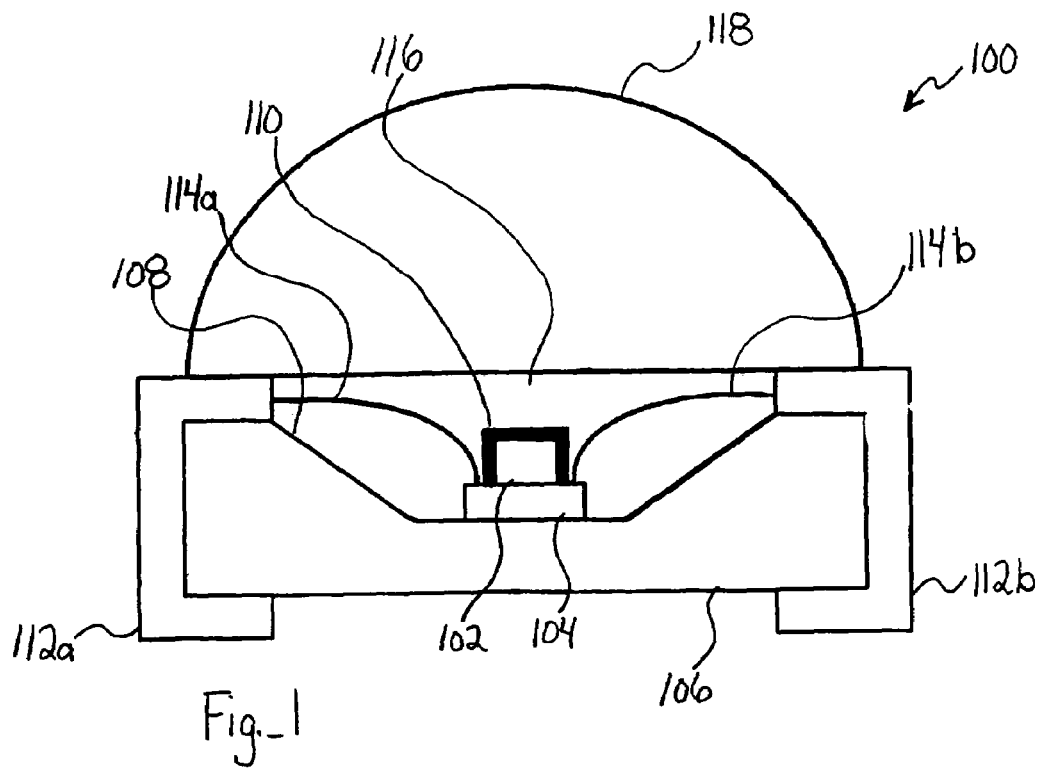
FIG. 1 illustrates an embodiment of the present invention.

Before the invention is described in detail, it is to be understood that unless otherwise indicated this invention is not limited to particular materials, reagents, reaction materials, manufacturing processes, or the like, as such may vary. It is also to be understood that the terminology used herein is for purposes of describing particular embodiments only, and is not intended to be limiting. It is also possible in the present invention that steps may be executed in different sequence where this is logically possible. However, the sequence described below is preferred.

It must be noted that, as used in the specification and the appended claims, the singular forms "a," "an" and "the" include plural referents unless the context clearly dictates otherwise. Thus, for example, reference to "a phosphor particle" includes a plurality of phosphor particles. In this specification and in the claims that follow, reference will be made to a number of terms that shall be defined to have the following meanings unless a contrary intention is apparent.

As used herein, "LED" or "light emitting diode" refers to a device having stack of semiconductor layers (a "chip"), including an active region which emits light when biased to produce an electrical current flow through the device, and contacts attached to the stack. A "cyan LED" is an LED that emits cyan light, e.g. in the wavelength range from 490 nm to 530 nm. Cyan light is light having a wavelength in the range from 490 nm to 530 nm. Red light is light having a wavelength in the range from about 610 nm to 650 nm. Red-orange light is light having a wavelength in the range from 590 nm to about 610 nm. "Phosphor" refers to any luminescent materials which absorb light of one wavelength and emit light of a different wavelength. "Light emitting device" refers to a device that includes an LED and a phosphor composition, wherein the phosphor composition is adapted to receive excitation light from the LED and emit light having a longer wavelength than the excitation light. "White light emitting device" refers to a light emitting device that is capable of producing white light. "White light" refers to light that is perceived as white by a typical human observer; particular embodiments of white light include light that has a 'correlated color temperature' (CCT) in the range of about 3000 K to about 6500K and has a color rendering index ('CRI') of greater than about 85. In more typical embodiments, the CCT is in the range of about 4800 to about 6500K. In this regard, CCT is defined as the absolute temperature (expressed in degrees Kelvin) of a theoretical black body whose chromaticity most nearly resembles that of the light source. CRI is an indication of a light source's ability to show individual colors relative to a standard; the CRI value is derived from a comparison of the lamp's spectral distribution compared to a standard (typically a black body) at the same correlated color temperature. Both CCT and CRI are as known and used in the industry.

As used herein, when a light emission, e.g. from a phosphor composition or a diode, is said to occur at a given wavelength, or said to occur in a given wavelength range, it shall be interpreted as requiring that the emission is at least about 10% (typically at least about 20%) of the greatest relative intensity of emission that occurs at any wavelength in the range of 340 nm–700 nm. Thus, if a phosphor particle (or a phosphor composition) is said to emit light having a wavelength in the range of about 600 nm to about 625 nm, it is intended that the light emitted should be at least about 10% (typically at least about 20%) as intense at a wavelength in the range of about 600 nm to about 625 nm as compared to the intensity at the wavelength exhibiting the most intense emission (by the phosphor particle) over the wavelength range of 340 nm to 700 nm. As used herein, when a light emission, e.g. from a phosphor composition or an LED, is said to have a peak emission wavelength at a given wavelength (or in a given range), it shall be interpreted as requiring that the emission intensity at the given wavelength (or at a wavelength within the given range) is at least about 30% (typically at least about 40%) of the greatest relative intensity of emission that occurs at any wavelength in the range of 340 nm–700 nm.

EXAMPLES

The practice of the present invention will employ, unless otherwise indicated, conventional techniques of semiconductor manufacture, packaging, coating, materials synthesis, and the like, which are within the skill of the art. Such techniques are explained fully in the literature.

The following examples are put forth so as to provide those of ordinary skill in the art with a complete disclosure and description of how to perform the methods and use the compositions disclosed and claimed herein. Efforts have been made to ensure accuracy with respect to numbers (e.g., amounts, temperature, etc.) but some errors and deviations should be accounted for. Unless indicated otherwise, parts are parts by weight, temperature is in ° C. and pressure is at or near atmospheric. Standard temperature and pressure are defined as 20° C. and 1 atmosphere.

Now referring to the attached drawings, embodiments of the described invention will be described, below. With reference to FIG. 1, a light emitting device 100 according to the present invention is illustrated. The light emitting device 100 includes a cyan LED 102 in the form of a semiconductor chip. The cyan LED 102 is disposed on a submount heatsink 104, which is supported in a recess formed in a substrate 106. The substrate 106 has a reflective wall 108 for directing light from the light emitting device 100. The cyan LED 102 is coated with a phosphor composition 110. Contact terminals 112a, 112b adjacent to or supporting the substrate 106 are in electrical communication with the contacts of the cyan LED 102 via interconnect wires 114a, 114b. The recess in the substrate 106 is filled with a clear polymer matrix 116. A dome lens 118 is positioned adjacent the recess in the substrate 106 to direct light from the light emitting device 100. In this context, directing light from the light emitting device includes focusing and/or diffusing the light from the cyan LED and/or the phosphor composition.

In use, a potential is applied across the contact terminals 112a, 112b to produce a bias across the active region of the cyan LED 102. The cyan LED 102 emits cyan light in response to the bias across the active region. The emitted cyan light passes through the phosphor composition 110, and phosphor particles in the phosphor composition absorb a portion of the cyan light. The absorption of the cyan light by the phosphor particles results in down-conversion (conversion to longer wavelength) of the light, thus producing light having a wavelength longer than the cyan light. The phosphor particles are selected to produce red and/or red-orange light upon excitation by the cyan light. The light emitting device thus emits light having a plurality of wavelength components, due to (a) cyan light that passes (unabsorbed) through the phosphor layer, and (b) red and/or red-orange light resulting from down-conversion of phosphor-absorbed, LED-emitted cyan light.

Figure 2:
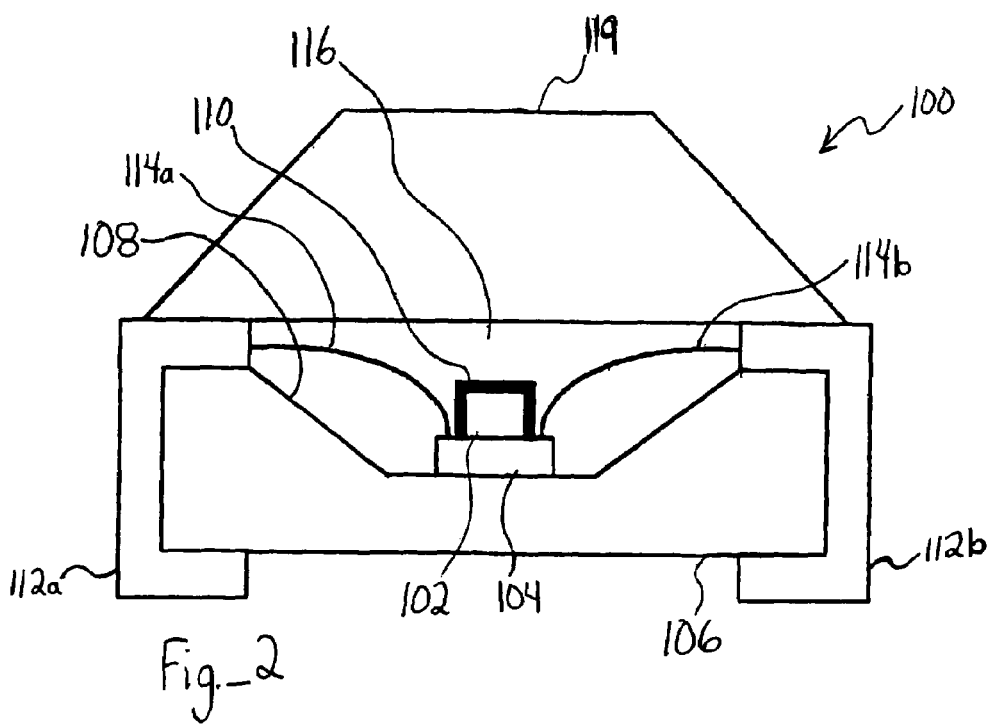
FIG. 2 depicts a further embodiment of the present invention.

Another embodiment of a device according to the present invention is illustrated in FIG. 2. A light emitting device 100 according to the present invention includes a cyan LED 102 in the form of a semiconductor chip. The cyan LED 102 is disposed on a submount heatsink 104, which is supported in a recess formed in a substrate 106. The substrate 106 has a reflective wall 108 for directing light from the light emitting device 100. The cyan LED 102 is coated with a phosphor composition 110. Contact terminals 112a, 112b adjacent to or supporting the substrate 106 are in electrical communication with the contacts of the cyan LED 102 via interconnect wires 114a, 114b. The recess in the substrate 106 is filled with a clear polymer matrix 116. A planar lens 119 is positioned adjacent the recess in the substrate 106 to direct light from the light emitting device 100.

The embodiment illustrated in FIG. 2 is used in much the same manner as that described for the embodiment shown in FIG. 1. In use, a potential is applied across the contact terminals 112a, 112b to produce a bias across the active region of the cyan LED 102. The cyan LED 102 emits cyan light in response to the bias across the active region. The emitted cyan light passes through the phosphor composition 110, and phosphor particles in the phosphor composition absorb a portion of the cyan light. The absorption of the cyan light by the phosphor particles results in down-conversion of the light, thus producing light having a wavelength longer than the cyan light. The phosphor particles are selected to produce red and/or red-orange light upon excitation by the cyan light. The light emitting device thus emits light having a plurality of wavelength components, due to (a) cyan light that passes (unabsorbed) through the phosphor layer, and (b) red and/or red-orange light resulting from down-conversion of phosphor-absorbed, LED-emitted cyan light.

Any cyan LED that outputs light in the desired wavelength range may potentially be used in a light emitting device according to the present invention. Such cyan LEDs have been described, and methods of making the semiconductor stack in the production of cyan LEDs are well known in the art. The cyan LED is typically an InGaN LED that emits light in the range of about 490 nm to about 505 nm. In some embodiments the cyan LED emits light in the range of about 495 nm to about 525 nm. The exact wavelength range will be determined by selection from available sources, desired color attributes of the light emitting device (e.g. the 'correlated color temperature' of the emitted white light), choice of phosphor composition, and the like. Variation of such design parameters are within ordinary skill in the art given the disclosure herein.

The cyan LED typically is mounted to a substrate, optionally via a submount heatsink. The substrate may be any suitable material providing mechanical support for one or more of the cyan LED, the heatsink, any optional submount, and/or the contact terminals. The cyan LED may be mounted on a silicon carbide submount. In certain embodiments, the cyan LED is placed within an optical cavity for light collimating purposes. The cyan LED has a semiconductor stack and contacts for applying a bias across the semiconductor stack. The contacts are typically wirebonded to contact terminals.

In the embodiments illustrated in FIGS. 1 and 2, the cyan LED has a surface that is coated with the phosphor composition. In other embodiments, the phosphor composition is located other than on the cyan LED surface, e.g. on a surface of the lens or on a surface of the reflective wall of the substrate, provided the phosphor composition is positioned to receive light from the cyan LED. The surface on which the phosphor composition is disposed is herein referred to as the phosphor-bearing surface. The phosphor composition may be deposited on the phosphor-bearing surface through any art-recognized techniques, including painting, spin coating, molding, encapsulation in a matrix, or any other suitable means. The thickness of the phosphor composition on the phosphor-bearing surface is typically in the range of about 15 micrometers to about 150 micrometers, more typically in the range of about 20 micrometers to about 120 micrometers, yet more typically in the range of about 25 micrometers to about 100 micrometers, although certain embodiments may be outside those ranges. The phosphor composition will typically be a conformal coating on the phosphor-bearing surface. The conformal coating is a coating having a uniform thickness, wherein the thickness does not vary by more than about 20%, typically not by more than about 10%. The phosphor composition may be deposited on the phosphor-bearing surface via an electrophoretic process, such as a process disclosed in U.S. patent application 2002/0187571, or in U.S. patent application Ser. No. 10/425,860, filed Apr. 28, 2003.

In an alternate embodiment, the phosphor composition comprises phosphor particles suspended in a clear polymer matrix, such as a resin, that fills the recess in the substrate and partly surrounds the cyan LED. Similarly, the lens may be made of a clear polymer material in which phosphor particles are suspended. Such a lens made of the clear polymer material with phosphor particles suspended therein is positioned to receive light from the cyan LED and to direct light from the light emitting device. Such embodiments will typically have more spatial variation in the output light, since the path length of the light through the polymer will typically vary.

The phosphor composition typically includes phosphor particles and a binder material immobilizing the phosphor particle to a phosphor-bearing surface. The appropriate binder will be selected with reference to the particular method used for coating the phosphor-bearing surface. Suitable binders have been described and are known in the art. See, for example, binders disclosed in U.S. Pat. No. 6,576,488 to Collins et al. which discloses exemplary binders which may be used in the current invention, including an organic material such as an optical coupling epoxy, an optical coupling silicone, inorganic metal oxide or glass frit powder (e.g., a PbO-based glass), or sol-gel. Binder material may be infused into the phosphor matrix by selective deposition and capillary action after the phosphor particles are deposited on the phosphor-bearing surface. Binder material may be co-deposited with the phosphor particles onto the phosphor-bearing surface during an electrophoretic deposition process. See also U.S. Pat. No. 6,180,029, WIPO Publ'n no. 00/33390 which describe binder materials, clear polymers, and phosphors for use in phosphor-conversion diodes.

The phosphor particles are characterized as being capable of down-conversion of cyan light to produce red and/or red-orange light. Typical phosphor particles suitable for use in the phosphor composition comprise a material selected from $SrS:Eu^{2+}$; $CaS:Eu^{2+}$; $CaS:Eu^{2+}, Mn^{2+}$; $(Zn,Cd)S:Ag^{+}$; $Mg_4GeO_{5.5}F:Mn^{4+}$; $ZnS:Mn^{2+}$, and other phosphor materials having emission spectra in the red and/or red-orange region of the visible spectrum upon excitation with cyan light from a cyan LED as described herein. The phosphor particles typically have a peak emission wavelength in the range of about 590 nm to about 650 nm In particular embodiments, the phosphor particles have a peak emission wavelength in the range of about 620 nm to about 650 nm, typically in the range of about 625 nm to about 645 nm, more typically in the range of about 630 nm to about 640 nm. In some embodiments, the phosphor particles have a peak emission wavelength in the range of about 590 nm to about 625 nm, typically in the range of about 60 nm to about 615 nm. In some embodiments, the phosphor particles emit light having a wavelength in the range of about 590 nm to about 650 nm, typically in the range of about 600 nm to about 640 nm, more typically in the range of about 610 nm to about 630 nm. The exact wavelength range will be determined by selection from available sources of phosphors, desired color attributes of the light emitting device (e.g. the 'correlated color temperature' of the emitted white light), choice of LED, and the like. Variation of such design parameters are within ordinary skill in the art given the disclosure herein.

The phosphor particles typically may be obtained in a range of particle sizes. In some embodiments, the mean particle diameter of the phosphor particles is in the range of 2–5 micrometers. Larger phosphor particles tend to emit light more efficiently; however, obtaining uniform coatings of phosphor particles becomes more difficult as size increases. Electrophoretic deposition methods have been used successfully with larger phosphor particles, e.g. having mean particle diameter in the range of about 13 micrometers to about 20 micrometers, and a $d_{90}$ in the range of about 30 micrometers to about 45 micrometers, where $d_{90}$ refers to the size at which 90 percent of the particles are smaller than the indicated size.

Phosphor particles for certain embodiments may be obtained from Phosphor Technology, Ltd. (Essex, England). A suitable phosphor obtained from this source is Strontium Sulphide: Europium (SrS:Eu) (Part no. name: HL63/S-Dx. This phosphor material has a particle size distribution (as measured by a Coulter Counter with 50 micron aperture) as shown below:

| Ultrasonic Dispersion. Size at listed Volume % | | | | | |
|---|---|---|---|---|---|
| vol % | 5 | 25 | 50 | 75 | 95 |
| micron | 2.3 | 3.5 | 5.0 | 7.2 | 11.9 |
| Quartile Deviation: 0.35 | | | | | |

This phosphor material has an emission wavelength peak at 615 nm and an excitation wavelength peak in the range from about 460 to about 490 nm. Other suitable phosphors for use in devices according to the present invention may be obtained from this and other commercial sources. The preparation of phosphors is described in the literature and suitable phosphors may be prepared accordingly by one of ordinary skill given the disclosure herein.

While the foregoing embodiments of the invention have been set forth in considerable detail for the purpose of making a complete disclosure of the invention, it will be apparent to those of skill in the art that numerous changes may be made in such details without departing from the spirit and the principles of the invention. Accordingly, the invention should be limited only by the following claims.

All patents, patent applications, and publications mentioned herein are hereby incorporated by reference in their entireties.

What is claimed is:

1. A white-light emitting device comprising a cyan LED and a phosphor composition positioned to receive light from said cyan LED, wherein the phosphor composition is a conformal coating disposed on a surface of the cyan LED, the coating being between about 15 micrometers and about 150 micrometers thick, and
   wherein the phosphor composition is capable of absorbing light from said cyan LED and emitting red light.

2. The light emitting device of claim 1, wherein the phosphor composition emits light having a wavelength in the range of about 600 to about 650 nm.

3. The light emitting device of claim 1, wherein the cyan LED is disposed in a recess formed in a substrate and the phosphor composition is disposed on a surface of the substrate, wherein the surface is reflective.

4. The light emitting device of claim 3, wherein the phosphor composition comprises a clear polymer matrix having phosphor particles suspended therein, the clear polymer matrix being disposed in said recess around the cyan LED.

5. The light emitting device of claim 1, wherein the phosphor composition is disposed on a surface of a lens positioned adjacent the cyan LED.

6. The light emitting device of claim 1, wherein the phosphor composition comprises a clear polymer matrix having phosphor particles suspended therein, wherein the clear polymer matrix is shaped as a lens, the clear polymer martix being positioned to receive light from the cyan LED and to direct light from the light emitting device.

7. The light emitting device of claim 1, wherein the phosphor composition comprises a material selected from $SrS:EU^{2+}$; $CaS:Eu^{2+}$; $CaS:Eu^{2+}Mn^{2+}$; $(Zn,Cd)S:Ag^{30}$; $Mg_4GeO_{5.5}F:Mn^{4+}$; and $ZnS:Mn^{2+}$.

8. The light emitting device of claim 7, wherein the phosphor composition comprises a material selected from $SrS:EU^{2+}$; $CaS:Eu^{2+}$.

9. The light emitting device of claim 7, wherein the phosphor composition comprises a material selected from $CaS:Eu^{2+}$, $Mn^{2+}$ and $(Zn,Cd)S:Ag^+$.

10. The light emitting device of claim 7, wherein the phosphor composition comprises a material selected from $Mg_4GeO5.5F:Mn^{4+}$; and $ZnS:Mn^{2+}$.

11. The light emitting device of claim 1, wherein the phosphor composition has a peak emission wavelength in the rage of about 620 nm to about 650 nm.

12. The light emitting device of claim 1, wherein the phosphor composition has a peak emission wavelength in the rage of about 600 nm to about 625 nm.

13. The light emitting device of claim 1, wherein the phosphor composition comprises phosphor particles having a mean particle diameter in the range of about 13 to about 20 micrometers.

14. The light emitting device of claim 1, wherein the phosphor composition is deposited on the cyan LED via an electrophoretic process.

15. A white-light emitting device comprising a cyan LED and a phosphor composition positioned to receive light from said cyan LED;
   wherein the phosphor composition comprises phosphor particles having a mean particle diameter in the range of about 13 to about 20 micrometers; and
   wherein the phosphor composition is capable of absorbing light from said cyan LED and emitting red light.

16. The light emitting device of claim 14, wherein the phosphor composition comprises a material selected from $SrS:EU^{2+}$; $CaS:Eu^{2+}$; $CaS:Eu^{2+}$, $Mn^+$; $(Zn,Cd)S:Ag^+$; $Mg^4GeO_{5.5}F:Mn^{4+}$; and $ZnS: Mn^{2+}$.

* * * * *